United States Patent
Lee et al.

(10) Patent No.: US 10,164,208 B2
(45) Date of Patent: Dec. 25, 2018

(54) FOLDABLE DISPLAY DEVICE

(71) Applicant: LG Display Co., Ltd., Seoul (KR)

(72) Inventors: Seung Kyu Lee, Bucheon-si (KR); Joo Hye Park, Anyang-si (KR); Noh Jin Myung, Paju-si (KR); Wan Soo Lee, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/855,806

(22) Filed: Dec. 27, 2017

(65) Prior Publication Data

US 2018/0190936 A1     Jul. 5, 2018

(30) Foreign Application Priority Data

Dec. 30, 2016    (KR) .......................... 10-2016-0184477

(51) Int. Cl.
| | |
|---|---|
| *G06F 1/16* | (2006.01) |
| *H01L 51/52* | (2006.01) |
| *B32B 3/30* | (2006.01) |
| *B32B 7/12* | (2006.01) |
| *B32B 25/20* | (2006.01) |
| *H01L 27/32* | (2006.01) |

(52) U.S. Cl.
CPC ............ *H01L 51/5237* (2013.01); *B32B 3/30* (2013.01); *B32B 7/12* (2013.01); *B32B 25/20* (2013.01); *B32B 2457/206* (2013.01); *H01L 27/3244* (2013.01); *H01L 2251/5338* (2013.01); *H01L 2251/558* (2013.01)

(58) Field of Classification Search
CPC ............................... G06F 1/1641; G06F 1/1652
See application file for complete search history.

(56) References Cited

U.S. PATENT DOCUMENTS

| | | | | |
|---|---|---|---|---|
| 2014/0226275 | A1* | 8/2014 | Ko | ................. G06F 1/1626 361/679.27 |
| 2018/0097197 | A1* | 4/2018 | Han | ................. H01L 51/0097 |

FOREIGN PATENT DOCUMENTS

| | | | |
|---|---|---|---|
| CN | 103810945 A | | 5/2014 |
| CN | 106252378 A | | 12/2016 |

(Continued)

OTHER PUBLICATIONS

Office Action with English translation dated Oct. 30, 2018 issued in the corresponding Taiwanese Patent Application No. 106146580, pp. 1-6.

*Primary Examiner* — Anthony Q Edwards
(74) *Attorney, Agent, or Firm* — Polsinelli PC

(57) ABSTRACT

Disclosed is a foldable display device capable of preventing distortion of a folding part of a display screen due to deformation of the folding part. The foldable display device includes a display panel including a folding part and non-folding parts, and a back cover attached to the rear surface of the display panel via an adhesive layer, wherein the back cover includes folding patterns and open patterns, both of which are disposed at the folding part, and unevenness compensation patterns disposed on areas of a surface of the back cover contacting the adhesive layer, the areas of the surface of the back cover corresponding to the non-folding parts. The unevenness compensation patterns may be a plurality of open patterns, which are fully formed through the back cover, or may be a plurality of grooves, which are not fully formed through the back cover.

27 Claims, 8 Drawing Sheets

(56) References Cited

FOREIGN PATENT DOCUMENTS

TW         201401240 A     1/2014
TW         201408178 A     2/2014

\* cited by examiner

FOLDABLE DISPLAY DEVICE

CROSS-REFERENCE TO RELATED APPLICATION

This application claims the benefit of Korean Patent Application No. 10-2016-0184477, filed on Dec. 30, 2016, which is hereby incorporated by reference in its entirety as if fully set forth herein.

BACKGROUND

Field of the Disclosure

The present disclosure relates to a foldable display device, and more particularly, to a foldable display device capable of preventing an image distortion or transcription on a display screen at a folding part caused by deformation on the folding part.

Description of the Background

An image display device, which realizes various pieces of information on a screen, is a core technology in the information and communication age, and is being developed in the direction of becoming thinner, lighter, more portable, and having higher performance. In response, a flat panel display device, which is thinner and lighter than a cathode ray tube (CRT), for example, an organic light-emitting display device, which controls the amount of light emitted from an organic light-emitting layer to display an image, is in the spotlight.

In an organic light-emitting display device, a plurality of pixels is arranged in a matrix form to display an image. Here, each pixel includes a light-emitting element, and a pixel drive circuit including, for example, a plurality of transistors to independently drive the light-emitting element.

Since such an organic light-emitting display device employs a self-luminous organic light-emitting element, the need for an additional light source is eliminated. In addition, since the organic light-emitting display device can be embodied as an ultrathin display device, research into an in-cell touch-type foldable display device, which employs organic light-emitting elements and include a touch electrode array in a light-emitting cell, has been actively conducted in recent years.

The foldable display device is designed so as to be folded in conjunction with a display panel contained therein. In order to protect the display panel having the flexible property, the foldable display device is provided with a back cover. Accordingly, the back cover, which is disposed on the rear surface of the display panel to protect the display panel, should also be designed so as to be foldable.

A back cover of the related art foldable display device includes a region corresponding to a folding part, which is made of silicon resin or the like so as to have a flexible structure, and a region corresponding to a non-folding part, which is made of metal, rigid plastic or the like so as to protect the display panel.

In the related art foldable display device adopting the back cover, the folding part and the non-folding part are usually made of different materials. Here, because the two materials have different physical properties, such as rigidity, elasticity, flexibility and the like, and are compressed to different extents while passing through processes, there is a high possibility that unevenness is generated at the boundary surface between the two different materials. The unevenness generated between the folding part and the non-folding part causes a phenomenon whereby a display screen is transcribed or distorted. Furthermore, the related art foldable display device adopting a back cover has other problems in that the flexible folding part can be curled upward or droops due to concentration of stress after being folded a number of times, and is deformed in its appearance or hardened under the condition of high temperature and humidity.

SUMMARY

Therefore, the present disclosure has been made in view of the above problems, and the present disclosure to provide a foldable display device, which is able to reduce a phenomenon of and distortion of a folding part and to prevent a display panel from drooping, and which has an excellent folding property.

To achieve the above object, a foldable display device according to the present disclosure includes a display panel including a folding part and non-folding parts, and a back cover attached to the rear surface of the display panel via an adhesive layer, wherein the back cover includes folding patterns and open patterns, both of which are disposed at the folding part, and unevenness compensation patterns disposed on areas of a surface of the back cover contacting the adhesive layer, the areas of the surface of the back cover corresponding to the non-folding parts.

The unevenness compensation patterns may be a plurality of open patterns, which are fully formed through the back cover, or may be a plurality of grooves, which are not fully formed through the back cover.

In another aspect of the present disclosure, a foldable display device comprises a display panel including a folding part and a non-folding part; and a back cover attached to a non-image displaying surface of the display panel through an adhesive layer and including a back cover folding part corresponding to the folding part and a back cover flat part corresponding to the non-folding part; wherein the back cover folding part includes a plurality of folding patterns and a plurality of first open patterns, and the back cover flat part includes a plate contacting the adhesive layer and a plurality of unevenness compensation patterns disposed in the plate, wherein the adhesive layer is at least partially filled in the plurality of first open patterns and a plurality of second open patterns of the plurality of unevenness compensation patterns.

In a further aspect of the present disclosure, a foldable display device comprises a display panel including a folding part and a non-folding part; and a back cover folding part including a plurality of folding patterns and a plurality of first open patterns; a back cover flat part including a plate and a plurality of unevenness compensation patterns disposed in the plate, wherein the plurality of unevenness compensation patterns includes a plurality of second open patterns; a back cover constituted of the back cover folding part and the back cover flat part; and an adhesive layer between the display panel and the back cover, wherein the adhesive layer is at least partially filled in the plurality of first open patterns and the plurality of second open patterns to compensate for a thickness difference between the folding part and the non-folding part in a folding state.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
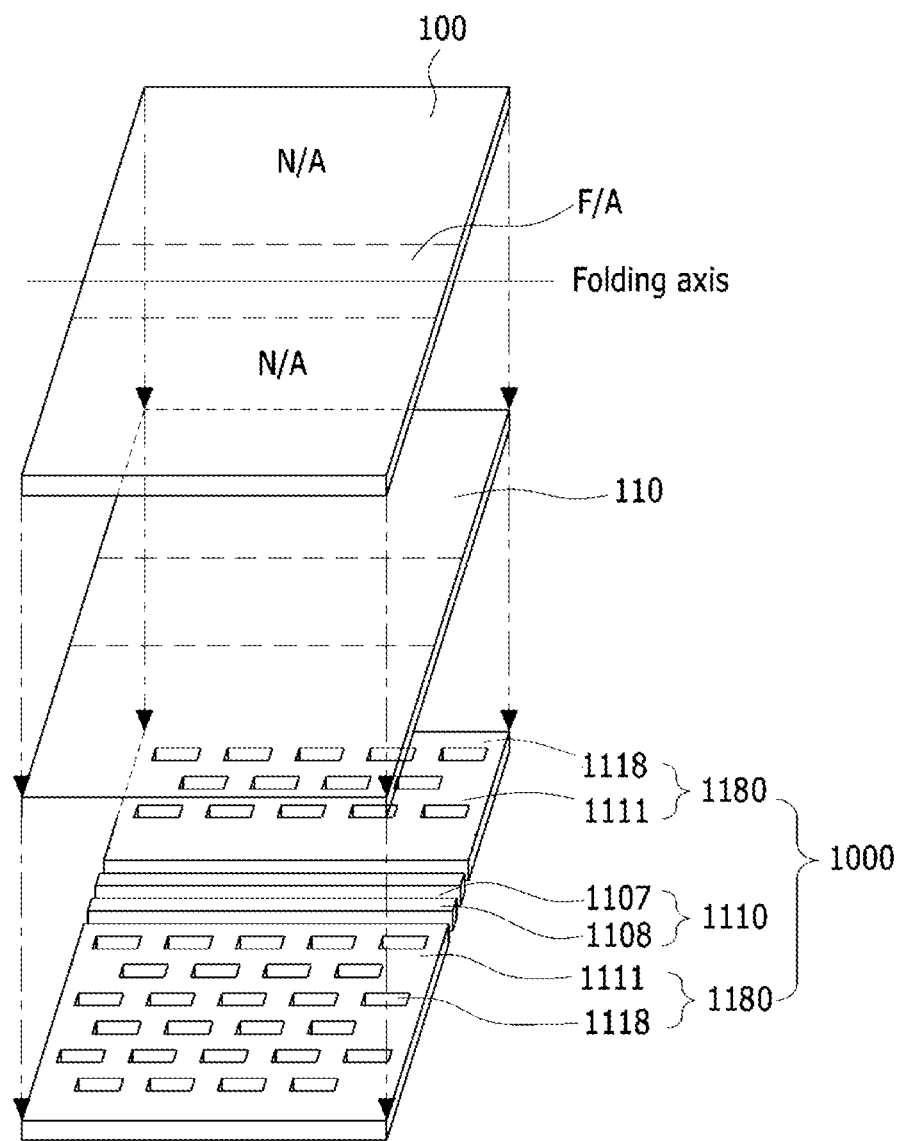
FIG. 1 is an exploded perspective view illustrating a foldable display device according to the present disclosure.

Hereinafter, exemplary aspects of the present disclosure will be described with reference to the accompanying drawings. In the specification, the same or similar elements are denoted by the same reference numerals even though they are depicted in different drawings. In the following description of the present disclosure, a detailed description of known functions and configurations incorporated herein will be omitted when it may make the subject matter of the present disclosure rather unclear. Also, the terms used in the following description are terms defined taking into consideration the functions obtained in accordance with the present disclosure, and may differ from the names of parts of actual products.

When an element or layer is referred to as being "on" another element or layer, it means not only the case where the element or layer is directly on another element or layer but also the case where a further element or layer is interposed therebetween. Meanwhile, when an element or layer is referred to as being in contact with another element or layer, it means the case where there is no intervening element or layer therebetween.

Sizes and thicknesses of parts shown in the drawings are illustrated for convenience of explanation, and the present disclosure is not necessarily limited to the sizes and thicknesses shown in the drawings.

FIG. 1 is an exploded perspective view of a foldable display device according to the present disclosure.

The foldable display device according to the present disclosure includes a display panel 100 having at least one folding part F/A capable of being folded and non-folding parts N/A occupying the remaining area of the display panel 100 excluding the folding part, and a back cover 1000 attached to the rear surface of the display panel 100 with an adhesive layer 110 disposed therebetween.

The folding part F/A has flexibility so as to be foldable. The non-folding parts N/A have a relatively high rigidity compared to the folding part F/A, but the present disclosure is not limited thereto. In some designs, both the folding part F/A and the non-folding parts N/A may be flexible while the areas of the back cover 1000 corresponding to the non-folding parts N/A may be rigid.

The display panel 100 is flexible and displays images for a user. In this regard, although the display panel 100 is advantageously made of an organic light-emitting panel, the display panel 100 may be made of various types of panels, that is, a liquid crystal display panel, an electronic portal imaging panel or the like, without being necessarily limited thereto.

The back cover 1000 includes a back cover folding part 1110 corresponding to the folding part F/A and flat parts 1180 corresponding to the non-folding parts N/A. The back cover folding part 1110 and the flat parts 1180 may be formed of the same material, such as metal having a high rigidity. The back cover folding part 1110 includes folding patterns 1108 for fold ability. The remaining area of the back cover folding part 1110 excluding the folding patterns 1108 is provided with open patterns 1107. Each of the flat parts 1180 includes a plate 1111.

The back cover 1000 is made of a material having high rigidity. The back cover 1000 includes at least one open pattern 1107 disposed on the rear surface of the folding part F/A of the display panel 100. The open pattern 1107 may be embodied as a hole fully formed through the entire thickness of the back cover 1000. With the formation of the open pattern 1107, the remaining area of the folding part 1110 is provided with the folding patterns 1108. Since the folding patterns 1108 are formed so as to have a predetermined shape, the folding patterns 1108 may serve to support the rear surface of the display panel 100, and may serve to assist in the folding of the back cover folding part 1110 at the time of folding.

The flat parts 1180 are disposed on the rear surface of the non-folding parts N/A of the display panel 100. The flat parts 1180 are provided with the plates 1111. The plates 1111 and the back cover folding part 1110 may be made of the same material. Each of the plates 1111 is provided with a plurality of unevenness compensation patterns 1118. The unevenness compensation patterns 1118 are formed at the surface of the plate 1111 that is in contact with the adhesive layer 110. Specifically, the unevenness compensation patterns 1118 are positioned at the flat parts 1180 of the back covers 1000, which are the areas corresponding to the non-folding parts N/A of the display panel 100, and are positioned at the surface of the back cover 1000 that is in contact with the adhesive layer 110.

Each of the open patterns 1107 may be formed as a hole or a slit shape, which is fully formed through the back cover 1000 so as to be open to a partial area of the display panel 100 or the adhesive layer 110, by patterning the material constituting the back cover 1000. In the aspect shown in FIG. 1, although each of the open patterns 1107 is illustrated as being formed into a slit shape parallel to the folding axis, the present disclosure is not limited to the aspect shown in FIG. 1, and the open patterns 1107 may be formed as various shapes.

The folding patterns 1108 and the open patterns 1107 may serve to enable the back cover folding part 1110, which is made of a rigid material, to be folded. The folding patterns 1108 are formed at the area of the back cover folding part 1110, which is the remaining area excluding the open patterns 1107, by patterning the back cover folding part 1110 for formation of the open patterns 1107. The folding patterns 1108 may be formed into various shapes so as to enable the back cover folding part 1110 to be folded.

FIG. 1 illustrates an aspect of the present disclosure in which each of the folding patterns 1108 is formed into a bar shape parallel to the folding axis, which is one example of the shape that the folding pattern 1108. Although each of the open patterns 1107 may be formed as a linear shape parallel to the folding axis, shapes of the folding pattern 1108 and the open patterns 1107 are not necessarily limited to those described above.

The flat part 1180 includes the plate 1111 and the unevenness compensation patterns 1118 formed in the plate 1111. The unevenness compensation patterns 1118 may serve to compensate for the thickness difference between the folding part F/A and the non-folding part N/A of the display panel 100, which is attributable to the presence of the open patterns 1107.

In the case where there is no unevenness compensation pattern 1118, the thickness of the adhesive layer 110 decreases as the adhesive material of the adhesive layer 110 is introduced into the open patterns 1107. In this case, since the thickness of the adhesive layer 110 on the open patterns 1107 decreases relative to the thickness of the adhesive layer 110 on the plate 1111, which remains constant, a difference is generated between the thickness of the adhesive layer 110 disposed on the open patterns 1107 and the thickness of the adhesive layer 110 disposed on the plate 1111.

When the thickness difference is generated at the adhesive layer 110, the flexible display panel 100 attached to the adhesive layer 110 having the thickness difference is influenced by the thickness difference of the adhesive layer 110, and the flatness of the display panel 100 can be deteriorated.

The thickness difference between the adhesive layer 110 disposed on the open patterns 1107 and the adhesive layer 110 disposed on the plate 1111, which is caused by reduction in the thickness of the adhesive layer 110 due to the introduction of the adhesive material of the adhesive layer 110 into the open patterns 1107, is compensated for in such a way that the adhesive material of the adhesive layer 110 is introduced into the unevenness compensation patterns 1118 formed in the plate 1111 and the thickness of the adhesive layer 110 disposed on the plate 1111 is also reduced. With the formation of the unevenness compensation patterns 1118, the adhesive layer 110 functioning to attach the display panel 100 to the back cover 1000 becomes flat, and the flatness of the display panel 100 disposed on the adhesive layer 110 is thus improved.

Here, the open patterns 1107 and the unevenness compensation patterns 1118 may be concurrently formed through a patterning process.

Figure 2:
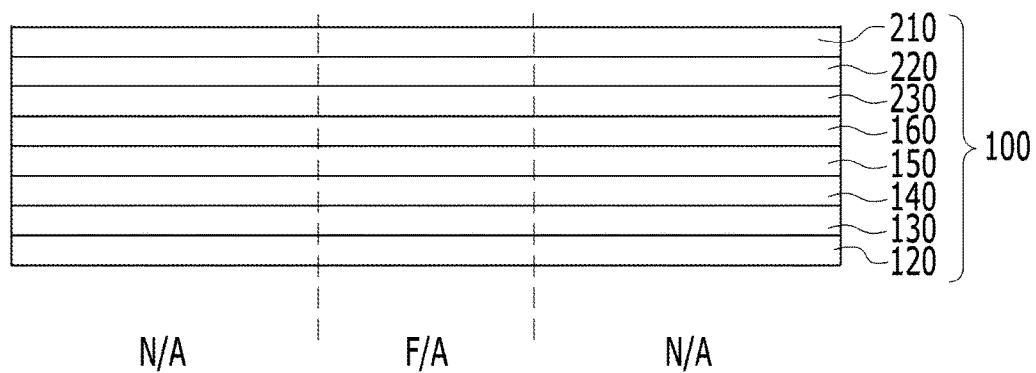
FIG. 2 is a cross-sectional view illustrating a display panel, which is an organic light-emitting display device.

FIG. 2 is a cross-sectional view illustrating the display panel 100, which is constituted of an organic light-emitting display device.

The display panel 100 may include a first substrate 120, a first buffer layer 130 disposed on the first substrate 120, a thin-film transistor array 140 defining pixels on the first buffer layer 130 in a matrix fashion in which each of the pixels has a thin-film transistor, an organic light-emitting array 150 connected to the respective thin-film transistors of the pixels, a protective layer 160 covering the thin-film transistor array 140 and the organic light-emitting array 150, excluding a pad part, a touch electrode array 230 attached to the protective layer 160 with a second adhesive layer 400 disposed therebetween, a second buffer layer 220 formed on the touch electrode array 230, and a second substrate 210 formed on the second buffer layer 220. However, the display panel 100 is not necessarily limited to this construction, and various display panels may be provided depending on the design.

Figure 3:
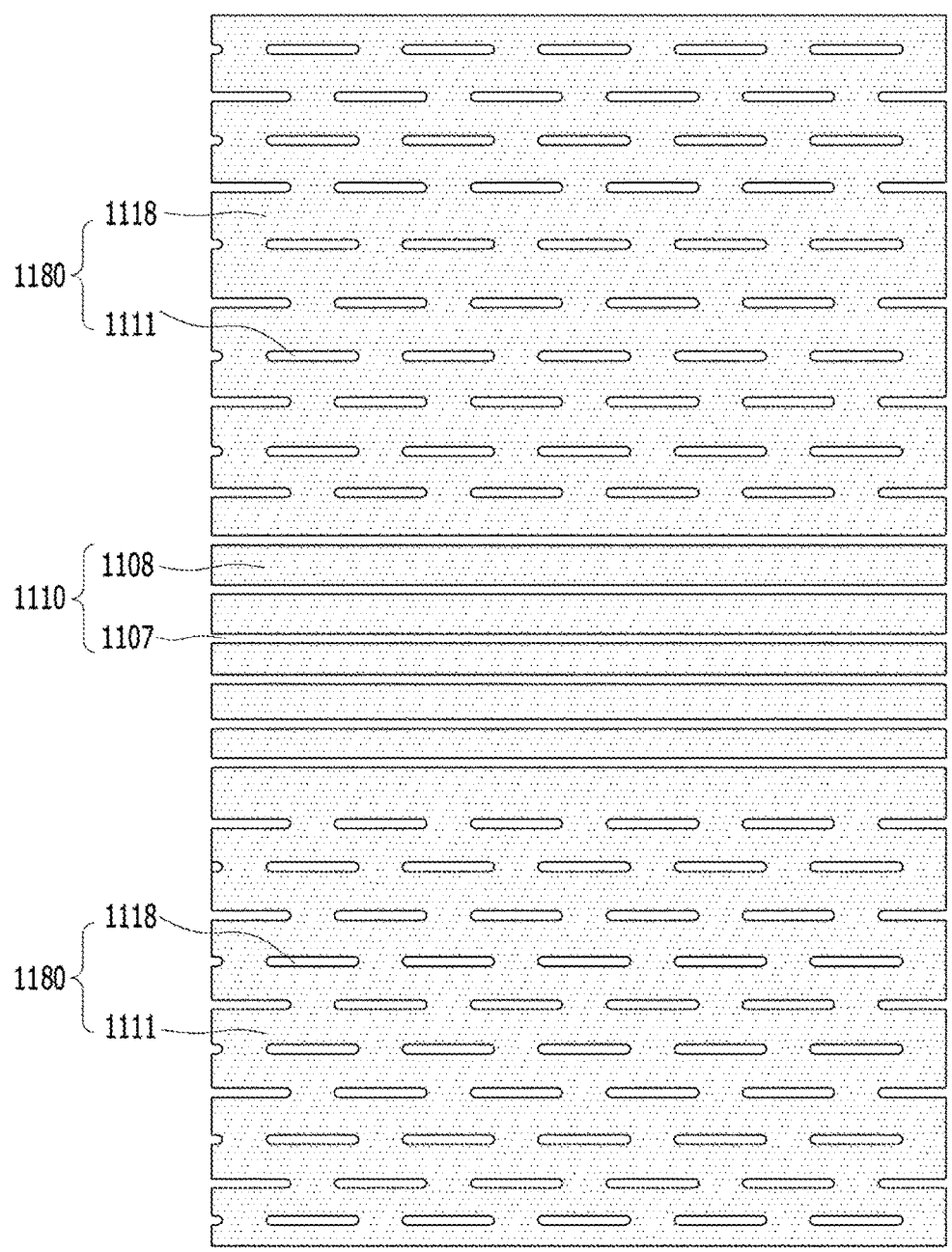
FIG. 3 is a rear view illustrating the rear surface of a back cover including unevenness compensation patterns, according to an aspect of the present disclosure.
Figure 4:
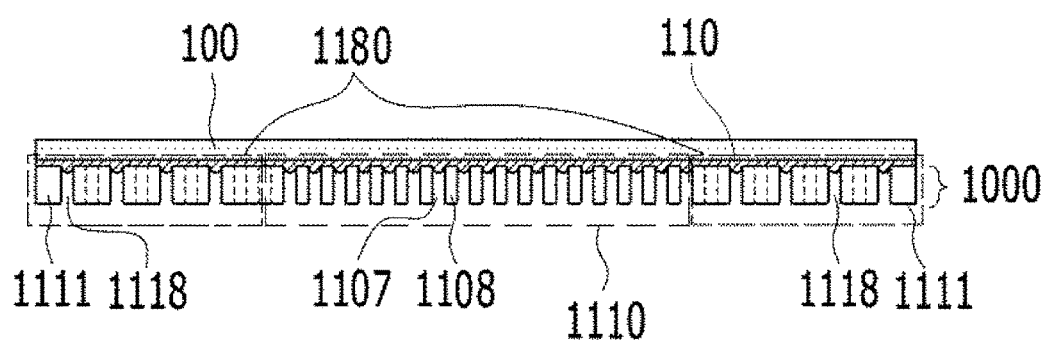
FIG. 4 is a side view illustrating a section of the back cover.

FIG. 3 is a rear view illustrating the rear surface of the back cover 1000 including the unevenness compensation patterns 1118 according to an aspect of the present disclosure, and FIG. 4 is a side view illustrating the section of the back cover 1000.

Referring to FIG. 3, each of the folding patterns 1108 may include a linear shape, that is, a bar shape parallel to the folding axis. In this aspect, the folding patterns 1108 include a plurality of bar-shaped folding patterns, which are spaced apart from each other. Each of the bar-shaped folding patterns 1108 may have a continuous or discontinuous linear shape, or may have various other shapes. The shapes of the folding patterns 1108 will be described later.

As mentioned above, each of the open patterns 1107 may be formed into a hole or a slit shape, which is open to the display panel 100 or the adhesive layer 110, by patterning the material constituting the back cover 1000. The open patterns 1107 may be formed between the folding patterns 1108, and each of the open patterns 1107 may have a continuous or discontinuous linear shape, similar to the folding patterns 1108. When the open patterns 1107 may be linear, as in this aspect, the open patterns 1107 may be disposed so as to be parallel to the folding pattern 1108.

The plates 1111 are provided with the unevenness compensation patterns 1118. Referring to FIG. 4, an aspect includes the open patterns positioned at the back cover folding part 1110 and the unevenness compensation patterns 1118. Each of the unevenness compensation patterns 1118 may have an open pattern shape, which is fully formed through the plates 1111.

Referring again to FIG. 3, the unevenness compensation patterns 1118 may be linear parallel to the folding axis. Specifically, the unevenness compensation patterns 1118 may have a discontinuous linear shape. In other words, each of the unevenness compensation patterns 1118 may be shorter than the width of the display panel 100 in the direction of the folding axis, and may be formed over the entire surface of the plate 1111. Each of the unevenness compensation patterns 1118 may have a length ranging from several cm to several tens of cm, but is not limited thereto.

When the back cover 1000 is attached to the display panel 100 via the adhesive layer 110, the adhesive material of the adhesive layer 110 is introduced into the hole-shaped open patterns 1107 in the back cover folding part 1110. As the adhesive material is introduced into the open patterns 1107, the thickness of the adhesive layer 110 disposed on the back cover folding part 1110 becomes smaller than the thickness of the adhesive layer 110 disposed on the plate 1111. As a result, a thickness difference is caused between the back cover folding part 1110 and the plate 1111, and the display panel 100 cannot be flat due to the thickness difference, thereby causing the boundary between the back cover folding part 1110 and the plate 1111 to be visible.

However, in the case where the plate 1111 is provided with the unevenness compensation patterns 1118 illustrated in FIG. 4, since the adhesive material of the adhesive layer 110 is introduced not only into the open patterns 1107 but also into the unevenness compensation patterns 1118, the thickness of the adhesive layer 110 contacting the back cover folding part 1110 and the thickness of the adhesive layer 110 contacting the plate 1111 are similarly reduced, thereby preventing the generation of a thickness difference between the back cover folding part 1110 and the plate 1111.

Consequently, the display panel 100 remains in the initial flat state, and a boundary at the display panel 100 is invisible.

In this case, when the amount of adhesive material introduced into the open patterns 1107 is almost equal to the amount of the adhesive material introduced into the unevenness compensation pattern 1118, it is easy to control the thickness difference between the flat part 1180 and the back cover folding part 1110. Accordingly, in order to cause the amount of adhesive material introduced into the open patterns 1107 and the amount of adhesive material introduced into the unevenness compensation patterns 1118 to be equal to each other, it is preferable that the width of the open pattern 1107 and the width of the unevenness difference pattern 1118 be equal to each other.

Figure 5:
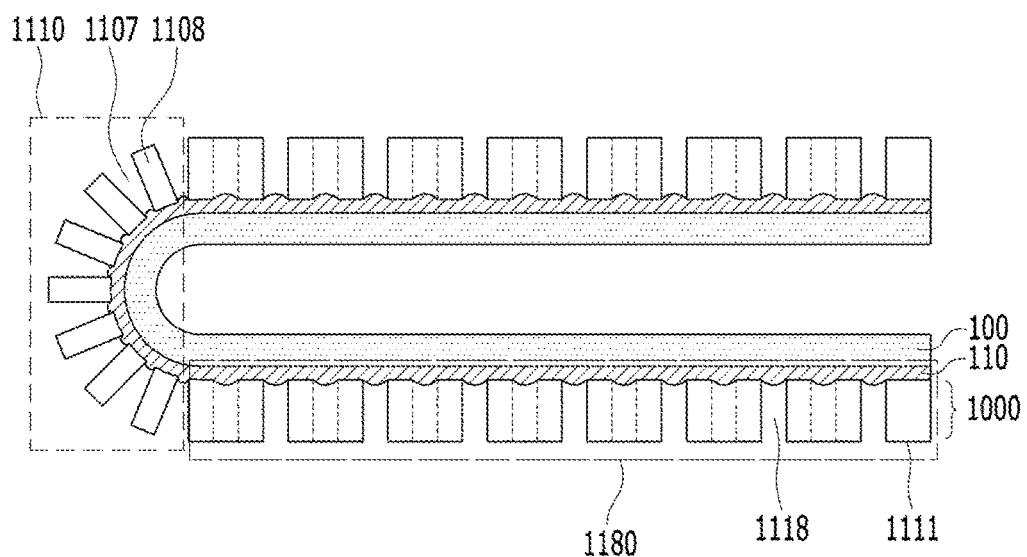
FIG. 5 is a side view illustrating the foldable display device according to the present disclosure in a folding state.

FIG. 5 is a side view illustrating the foldable display device in a folding state according to the present disclosure.

The foldable display device according to the present disclosure includes the folding patterns 1108 each having a fine size. Therefore, since at least some of the folding patterns 1108 are separated from each other, stress applied to the folding patterns 1108 is reduced when the back cover 1000 and the display panel 100 are folded. In addition, since the back cover 1000 according to the present disclosure is made of metal or the like, the foldable display device has high rigidity and high fold ability.

Furthermore, since the folding patterns 1108 support the display pattern 100 so as to enable the display panel 100 to have high rigidity, the display panel 100 does not droop, even in the event of a touch or the like, and user's convenience is thus improved even when a user uses the display panel 100 in an unfolding state.

As mentioned above, in related art, because the adhesive material of the adhesive layer 110 can be introduced into the open patterns 1107 and the thickness of the adhesive layer 110 disposed on the folding patterns 1108 is thus reduced, a thickness difference can be caused between the folding part F/A and the non-folding part N/A. According to the present disclosure, since the plate 1111 is also provided with the unevenness compensation patterns 1118, and the adhesive material of the adhesive layer 110 is also introduced into the unevenness compensation patterns 1118, it is possible to prevent the a thickness difference between the folding part F/A and the non-folding part N/A.

Figure 6A:
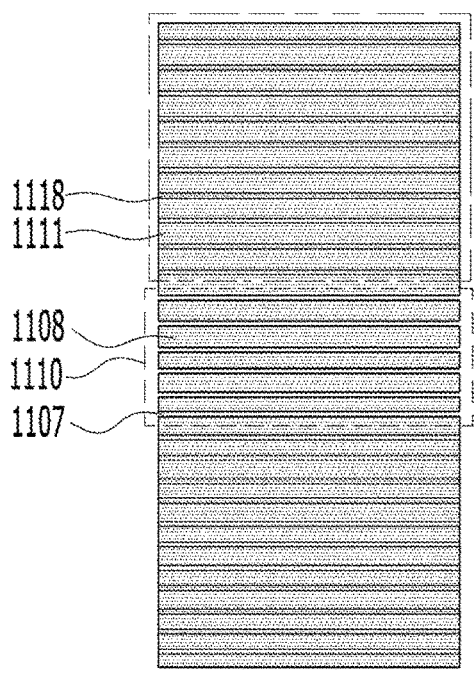
FIGS. 6A and 6B are schematic views illustrating a back cover including unevenness compensation patterns, according to another aspect of the present disclosure.
Figure 6B:
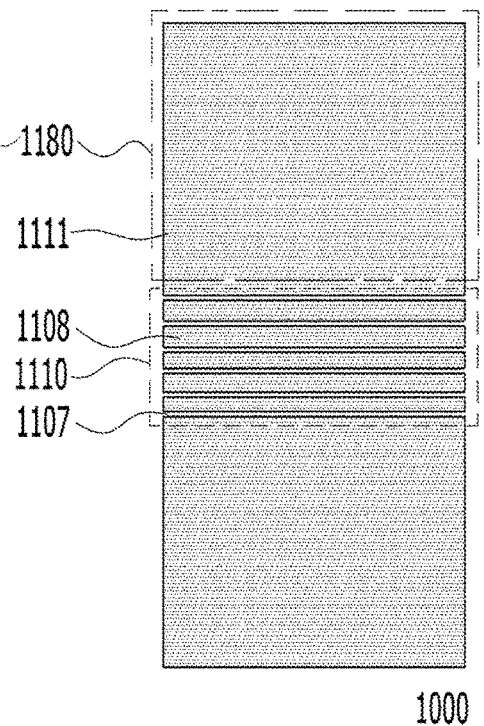

FIGS. 6A and 6B are schematic views illustrating a back cover 1000 including unevenness compensation patterns 1118 according to another aspect of the present disclosure, in which FIG. 6A is a view illustrating an example of the surface of the back cover 1000 that contacts the adhesive layer 110, and FIG. 6B is a view illustrating an example of the surface opposite to the surface of the back cover 1000 that contacts the adhesive layer 1110.

Referring to FIG. 6A, the construction in which the back cover folding part 1110 includes the folding patterns 1108 and the open patterns 1107 is the same as in the aspect described with reference to FIG. 3. Similar to the previously described aspect, the back cover 1000 according to another aspect includes unevenness compensation patterns 1118 formed in the plate 1111. However, the unevenness compensation patterns 1118 are not fully formed through the plate 1111 but each has a groove shape. Specifically, the unevenness compensation patterns 1118 and the open patterns 1107 have different heights, and the height of the unevenness compensation pattern 1118 is lower than the height of the open patterns 1107.

As a result, the unevenness compensation patterns 1118 are invisible from the rear surface of the back cover 1000, as shown in FIG. 6B. The unevenness compensation patterns 1118 according to the second aspect will also be referred to as grooves 1118 in the following description.

Although the unevenness compensation patterns 1118 are fully formed through the plate 1111 in a fashion similar to the open patterns in the first aspect, the unevenness compensation patterns 1118 do not necessarily need to be formed to have the shape of the through-open patterns because the unevenness compensation patterns 1118 are merely intended to allow the adhesive 110 to be introduced into the unevenness compensation patterns 1118. Consequently, in the second aspect, each of the unevenness compensation patterns 1118 is formed into a groove shape, and the rear surface of the back cover 1000 remains in a flat state.

Here, the unevenness compensation patterns 1118, each having a groove shape, may be linear. Each of the unevenness compensation patterns 1118 may have a length shorter than the length of the display panel 1000 in the direction of the folding axis or the width of the display panel 1000 such that each of the unevenness compensation patterns 1118 has a discontinuous linear shape. However, since the unevenness compensation patterns 1118 are connected to each other through the rear surface portion of the plate 1111, the plate 1111 is not separated even though each of the evenness compensation patterns 1118 has a length equal to the width of the display panel 1000 in the direction of the folding axis. Therefore, there is no problem even when each of the unevenness compensation patterns 1118 has a length equal to the width of the display panel 1000 in the direction of the folding axis.

Figure 7:
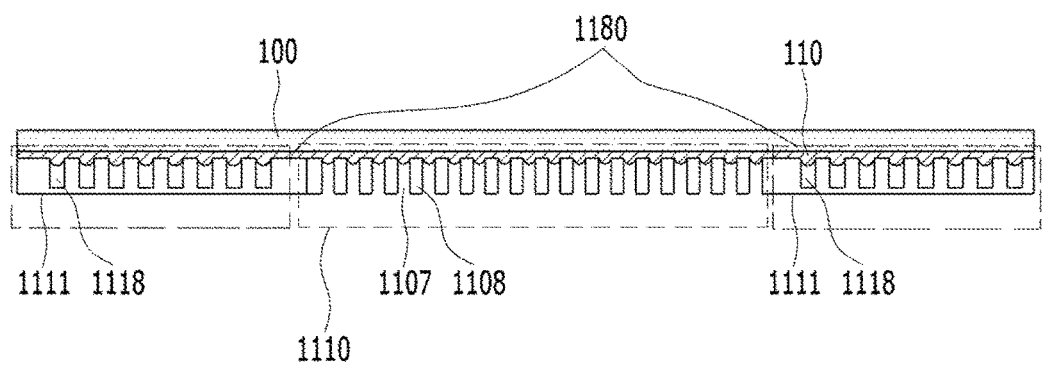
FIG. 7 is a cross-sectional view illustrating the foldable display device including the back cover, according to another aspect of the present disclosure.

FIG. 7 is a cross-sectional view illustrating the foldable display device including the back cover 1000 according to another aspect of the present disclosure.

Referring to FIG. 7, the plate 1111 is provided with the unevenness compensation patterns 1118. The cover folding part 1110 is provided with the folding patterns 1108 and the open patterns 1107 in the same manner as the aspect of the present disclosure related to FIG. 3.

The unevenness compensation patterns 1118 are not fully formed through the plate 111, but are formed such that each has a groove shape. Specifically, even though the unevenness compensation patterns 1118 are not fully formed through the plate 111, the adhesive material of the adhesive layer 110 disposed on the unevenness compensation patterns 1118 is introduced into the unevenness compensation patterns 1118, and the interior spaces of the unevenness compensation patterns 1118 are at least partially filled with the adhesive material of the adhesive layer 110. Accordingly, since the adhesive material is introduced not only into the open patterns 1107 but also into the unevenness compensation patterns 1107, the thickness of the adhesive layer 110 disposed on the back cover folding part 1110 and the thickness of the adhesive layer 110 disposed on the plate 1111 are similarly reduced, and thus there is no thickness difference between the back cover folding part 1110 and the plate 1111. Consequently, the display panel 100 remains in a flat state, and a boundary at the display panel 100 is invisible.

Similarly to the first aspect, the open patterns 1107 may have the same width as that of the unevenness compensation patterns 1118.

Although the first and second aspects show only the case where the open patterns 1107, the folding patterns 1108 and the unevenness patterns 1118 are formed to be linear, the open patterns 1107, the folding patterns 1108 and the unevenness patterns 1118 may have various shapes according to the design.

FIGS. 8A to 8F are views illustrating examples of shapes that the folding patterns 1108, the open patterns 1107 and the unevenness compensation patterns 1118.

FIGS. 8A to 8F show various examples of shapes that the folding patterns 1108 and the open patterns 1107 of the back cover folding part 1110 and the unevenness compensation patterns 1118 can have. However, the shapes of the folding patterns 1108, the open patterns 1107 and the unevenness compensation patterns 1118 are not limited to the above aspects, and may be variously modified according to the design.

Figure 8A:
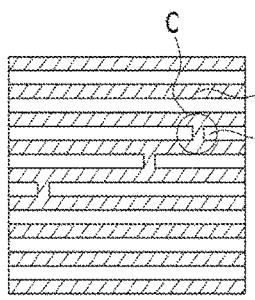
FIGS. 8A to 8F are views illustrating examples of shapes that folding patterns, open patterns and unevenness compensation patterns of the foldable display device in the present disclosure.

Referring to FIG. 8A, the folding patterns 1108 may be constituted by a plurality of metal bars, which are disposed to be parallel to the folding axis. Each of the metal bars may have the same length as the width of the display panel 100. Since the folding patterns 1108 are constituted of the metal bars, the open patterns 1107 may also be disposed to be parallel to the folding axis. In addition, the unevenness compensation patterns may also be formed so as to be linear, as mentioned above.

Although each of the metal bars may have the same length as the width of the display panel 100, the metal bars may not fully extend from one side to the opposite side of the display panel 100, and may have an interruption point. In other words, each of the open patterns 1107, which is linearly disposed so as to be parallel to the folding axis, may have a connecting open pattern C so as to be connected to the adjacent open pattern via the connecting open pattern C. Consequently, the metal bar-shaped folding pattern 1108 may be interrupted at the point at which the connecting open pattern is located.

Figure 8B:
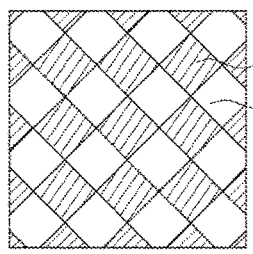
Figure 8C:
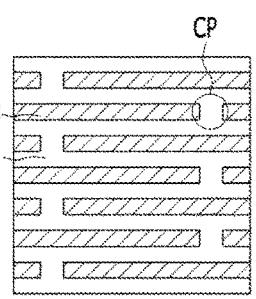
Figure 8D:
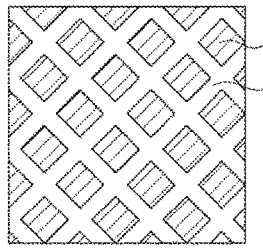

Referring to FIG. 8C, one of the metal bar-shaped folding patterns 1108 may be connected to the adjacent folding pattern 1108 via a connecting pattern CP, and the corresponding open pattern 1107 may thus be interrupted at the connecting pattern CP. In this case, the folding pattern 1108 may have the connecting open pattern C, and both the linear folding pattern 1108 and the linear open pattern 1107 may thus be interrupted.

Referring to FIG. 8B, both the open patterns 1107 and the unevenness compensation patterns 1118 may be formed so as to have a diamond shape. Since the open patterns 1107 have the diamond shape, the folding patterns 1108 may be disposed between the open patterns 1107 having the diamond shape. Similar to this, the unevenness compensation patterns 1118 may also have a diamond shape.

As shown in FIG. 8B, the folding patterns 1108 may be formed into diamond shapes, which are connected to each other in the horizontal and vertical directions. When the open patterns 1107 are formed into diamond shapes, which are densely arranged, the folding patterns 1108 may form a net shape overall.

Figure 8E:
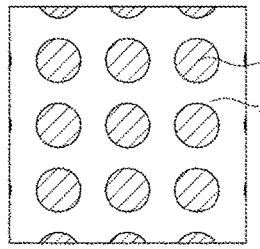
Figure 8F:
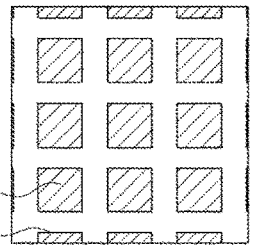

In addition, the open patterns 1107 and the unevenness compensation patterns 1118 may each have a circular or elliptic shape, as shown in FIG. 8E, or may each have a square shape, as shown in FIG. 8F.

The above-mentioned shapes of open patterns 1107, the unevenness compensation patterns 1118 and the folding patterns 1108 are only some of various shapes that the open patterns 1107, the unevenness compensation patterns 1118 and the folding patterns 1108 can have. The open patterns 1107, the unevenness compensation patterns 1118 and the folding patterns 1108 may have various shapes according to the design desired by a person having ordinary skill in the art.

Although each of the folding patterns 1108 is illustrated as having a large size for convenience of explanation, it should be noted that each of the folding patterns 1108 may actually have a fine size. Each of the folding patterns 1108 may be formed so as to have a fine size. When each of the folding patterns 1108 has, for example, a bar shape, the bar-shaped folding pattern 1107 may be formed so as to have a diameter of about 0.1-0.4 mm, and the open pattern 1107 may be formed so as to have a diameter of about 0.03-0.12 mm.

Accordingly, since each of the folding patterns 1108 has a fine diameter, the folding patterns 1108 realize easy folding of the foldable display device, and can efficiently support the rear surface of the display panel 100.

Although the foldable display device has been described as an example of the present disclosure in this disclosure, the technical concept of the present disclosure may also be applied to a lighting device.

As is apparent from the above description, when the back cover is attached to the display panel via the adhesive layer, the adhesive material of the adhesive layer is introduced into the hole-shaped open patterns in the back cover folding part. As the adhesive material is introduced into the open patterns, the thickness of the adhesive layer disposed on the back cover folding part becomes smaller than the thickness of the adhesive layer disposed on the plate of the flat part. As a result, the display panel becomes uneven due to the thickness difference attributable to the reduction in the thickness of the adhesive layer, and a boundary may thus be visible at the display panel.

In contrast, when the plate is provided with the unevenness compensation patterns according to the present disclosure, the adhesive material of the adhesive layer is introduced not only into the open patterns but also into the unevenness compensation patterns. As a result, since the thickness of the adhesive layer disposed on the open patterns and the thickness of the adhesive layer disposed on the plate are similarly reduced, there is no thickness difference between the open patterns and the plate. Consequently, the display panel remains in the flat state, and a boundary in the display panel is thus invisible.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Accordingly, various aspects disclosed in the present disclosure are not intended to limit the technical spirit of the present disclosure, and the scope of the technical spirit of the present disclosure is not limited by the aspects. Accordingly, the disclosed aspects are provided for the purpose of description and are not intended to limit the technical scope of the disclosure, and the technical scope of the disclosure is not limited by the aspects. The range of the disclosure should be interpreted based on the following claims, and all technical ideas that fall within the range equivalent to the claims should be understood as belonging to the scope of the disclosure.

What is claimed is:

1. A foldable display device comprising:
 a display panel including a folding part and a non-folding part; and
 a back cover on a rear surface of the display panel, attached via an adhesive layer, and including a back cover folding part corresponding to the folding part and a flat part corresponding to the non-folding part;
 wherein the back cover folding part includes a plurality of folding patterns and a plurality of first open patterns, and the flat part includes a plate contacting the adhesive layer and a plurality of unevenness compensation patterns formed in the plate to compensate for a thickness difference between the folding part and the non-folding part.

2. The foldable display device according to claim 1, wherein the plurality of unevenness compensation patterns includes a plurality of second open patterns, which are fully formed through the back cover.

3. The foldable display device according to claim 2, wherein the plurality of unevenness compensation patterns is disposed to be parallel to a folding axis where the folding part is folded.

4. The foldable display device according to claim 1, wherein the plurality of unevenness compensation patterns includes a plurality of grooves contacting the adhesive layer.

5. The foldable display device according to claim 4, wherein the plurality of unevenness compensation patterns is disposed to be parallel to a folding axis where the folding part is folded.

6. The foldable display device according to claim 5, wherein each of the plurality of unevenness compensation patterns has the same length as a width of the display panel in a direction of the folding axis.

7. The foldable display device according to claim 4, wherein the plurality of grooves is at least partially filled with the adhesive layer.

8. The foldable display device according to claim 4, wherein each of plurality of the unevenness compensation patterns has a height different from a height of each of the first open patterns.

9. The foldable display device according to claim 1, wherein the plurality of folding patterns includes a plurality of bar-shaped patterns disposed to be parallel to a folding axis where the folding part is folded, and
wherein the plurality of first open patterns is disposed to be parallel with the plurality of folding patterns, and is disposed between the plurality of folding patterns.

10. The foldable display device according to claim 9, wherein each of the plurality of folding patterns and the plurality of first open patterns has the same length as a width of the display panel in a direction of the folding axis.

11. The foldable display device according to claim 9, wherein at least one of the plurality of folding patterns is connected to an adjacent folding pattern via a connecting pattern (CP).

12. The foldable display device according to claim 9, wherein at least one of the plurality of first open patterns is connected to an adjacent open pattern via a connecting open pattern (C).

13. The foldable display device according to claim 1, wherein the plurality of first open patterns has a diamond shape, a circular shape, a rectangular shape or a net shape.

14. The foldable display device according to claim 1, wherein the plurality of unevenness compensation patterns has a diamond shape, a circular shape, a rectangular shape or a net shape.

15. A foldable display device comprising:
a display panel including a folding part and a non-folding part; and
a back cover attached to a non-image displaying surface of the display panel through an adhesive layer and including a back cover folding part corresponding to the folding part and a back cover flat part corresponding to the non-folding part;
wherein the back cover folding part includes a plurality of folding patterns and a plurality of first open patterns, and the back cover flat part includes a plate contacting the adhesive layer and a plurality of unevenness compensation patterns disposed in the plate,
wherein the adhesive layer is at least partially filled in the plurality of first open patterns and a plurality of second open patterns of the plurality of unevenness compensation patterns.

16. The foldable display device according to claim 15, wherein the plurality of second open patterns is fully formed through the back cover.

17. The foldable display device according to claim 15, wherein the plurality of unevenness compensation patterns is disposed to be parallel with a folding axis where the folding part is folded.

18. The foldable display device according to claim 15, wherein each of the plurality of unevenness compensation patterns has the same length as a width of the display panel in a direction of the folding axis.

19. The foldable display device according to claim 15, wherein each of plurality of the unevenness compensation patterns has a height different from a height of each of the first open patterns.

20. The foldable display device according to claim 15, wherein the plurality of folding patterns includes a plurality of bar-shaped patterns disposed to be parallel with a folding axis where the folding part is folded.

21. The foldable display device according to claim 15, wherein the plurality of first open patterns is disposed to be parallel with the plurality of folding patterns and between the plurality of folding patterns.

22. The foldable display device according to claim 15, wherein each of the plurality of folding patterns and the plurality of first open patterns have the same length as a width of the display panel in a direction of the folding axis.

23. The foldable display device according to claim 15, wherein at least one of the plurality of folding patterns is connected to an adjacent folding pattern through a connecting pattern (CP).

24. The foldable display device according to claim 15, wherein at least one of the plurality of first open patterns is connected to an adjacent open pattern through a connecting open pattern (C).

25. The foldable display device according to claim 15, wherein the plurality of first open patterns has a diamond shape, a circular shape, a rectangular shape or a net shape.

26. The foldable display device according to claim 15, wherein the plurality of unevenness compensation patterns has a diamond shape, a circular shape, a rectangular shape or a net shape.

27. A foldable display device comprising:
a display panel including a folding part and a non-folding part; and
a back cover folding part including a plurality of folding patterns and a plurality of first open patterns;
a back cover flat part including a plate and a plurality of unevenness compensation patterns disposed in the plate, wherein the plurality of unevenness compensation patterns includes a plurality of second open patterns;
a back cover constituted of the back cover folding part and the back cover flat part; and
an adhesive layer between the display panel and the back cover,
wherein the adhesive layer is at least partially filled in the plurality of first open patterns and the plurality of second open patterns to compensate for a thickness difference between the folding part and the non-folding part in a folding state.

\* \* \* \* \*